(12) United States Patent
Chow et al.

(10) Patent No.: US 12,137,619 B2
(45) Date of Patent: Nov. 5, 2024

(54) REDUCING QUBIT FREQUENCY COLLISIONS THROUGH LATTICE DESIGN

(71) Applicant: International Business Machines Corporation, Armonk, NY (US)

(72) Inventors: Jerry M. Chow, White Plains, NY (US); Easwar Magesan, Mount Kisco, NY (US); Matthias Steffen, Cortlandt Manor, NY (US); Jay M. Gambetta, Yorktown Heights, NY (US); Maika Takita, Croton-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 71 days.

(21) Appl. No.: 17/515,686

(22) Filed: Nov. 1, 2021

(65) Prior Publication Data
US 2022/0059749 A1    Feb. 24, 2022

Related U.S. Application Data

(62) Division of application No. 16/751,429, filed on Jan. 24, 2020, now Pat. No. 11,165,009, which is a
(Continued)

(51) Int. Cl.
*H10N 60/80* (2023.01)
*G06N 10/00* (2022.01)
*H10N 60/12* (2023.01)

(52) U.S. Cl.
CPC ........... *H10N 60/805* (2023.02); *G06N 10/00* (2019.01); *H10N 60/12* (2023.02)

(58) Field of Classification Search
CPC ....... H10N 60/805; H10N 60/12; G06N 10/00
See application file for complete search history.

(56) References Cited

U.S. PATENT DOCUMENTS

| 7,566,896 B2 | 7/2009 | Freedman et al. |
| 7,898,282 B2 | 3/2011 | Harris et al. |

(Continued)

FOREIGN PATENT DOCUMENTS

| CN | 101868802 A | 10/2010 |
| CN | 104050509 A | 9/2014 |

(Continued)

OTHER PUBLICATIONS

Notice of Reasons for Refusal received for Japanese Patent Application Serial No. 2020542845 dated Jul. 12, 2022, 8 pages (Including English Translation).
(Continued)

*Primary Examiner* — Matthew L Reames
(74) *Attorney, Agent, or Firm* — Amin, Turocy & Watson, LLP

(57) ABSTRACT

Lattice arrangements for quantum qubits are described. A lattice arrangement can comprise adjacent structures having vertices connected by edges. The qubits can be positioned on the vertices. A qubit in the lattice arrangement directly connects to not more than three other qubits, or connects to another qubit via a coupling qubit on an edge between two qubits on a vertex. The adjacent structures can comprise hexagons, dodecagons or octagons. A superconducting qubit lattice can comprise superconducting target qubits and superconducting control qubits. The superconducting qubit lattice can comprise adjacent structures having vertices connected by edges, with target qubits positioned on the vertices and control qubits positioned on the edges. Logic operations between adjacent superconducting target and control qubits can be implemented by driving the superconducting control qubit at or near the frequency of the superconducting target qubit.

23 Claims, 11 Drawing Sheets

Related U.S. Application Data division of application No. 15/934,457, filed on Mar. 23, 2018, now Pat. No. 10,622,536.

(56) References Cited

U.S. PATENT DOCUMENTS

| | | | |
|---|---|---|---|
| 8,190,548 | B2 | 5/2012 | Choi |
| 8,947,080 | B2 | 2/2015 | Lukin et al. |
| 9,843,312 | B2 | 12/2017 | Abdo |
| 2009/0121215 | A1 | 5/2009 | Choi |
| 2010/0148853 | A1 | 6/2010 | Harris et al. |
| 2014/0264283 | A1 | 9/2014 | Gambetta et al. |
| 2015/0032993 | A1 | 1/2015 | Amin et al. |
| 2016/0125311 | A1 | 5/2016 | Fuechsle et al. |

FOREIGN PATENT DOCUMENTS

| | | |
|---|---|---|
| CN | 107564868 A | 1/2018 |
| JP | 2008-525873 A | 7/2008 |
| WO | 2006/066415 A1 | 6/2006 |
| WO | 2017/021714 A1 | 2/2017 |
| WO | 2017/078734 A1 | 5/2017 |
| WO | 2017/115160 A1 | 7/2017 |

OTHER PUBLICATIONS

Notice of Allowance received for U.S. Appl. No. 15/934,457 dated Dec. 11, 2019, 24 pages.

Notice of Allowance received for U.S. Appl. No. 16/751,429 dated Jul. 22, 2021, 7 pages.

Notice of Allowance received for U.S. Appl. No. 16/751,429 dated Jul. 7, 2021, 15 pages.

Notice of Reasons for Refusal received for Japanese Patent Application Serial No. 2020542845 dated Jan. 17, 2023, 6 pages (Including English Translation).

International Search Report and Written Opinion received for PCT Application Serial No. PCT/EP2019/054934 dated Jun. 13, 2019, 19 pages.

Otterbach et al., "Unsupervised Machine Learning on a Hybrid Quantum Computer", Dec. 15, 2017, 17 pages.

Tsomokos et al., "Using Superconducting Qubit Circuits to Engineer Exotic Lattice Systems", Sep. 15, 2010, pp. 1-7.

King et al., "Observation of topological phenomena in a programmable lattice of 1,800 qubits", Mar. 6, 2018, 17 pages.

Chow et al., "Implementing a strand of a scalable fault-tolerant quantum computing fabric", Nature Communications, vol. 5, No. 1, Jun. 24, 2014, pp. 1-9.

Kim et al., "Scalable quantum computing model in the circuit-QED lattice with circulator function", Quantum Information Processing, vol. 16, No. 8, Jun. 28, 2017, pp. 1-12.

Fedorov et al., "P-wave superfluidity of atomic lattice fermions," Physical Review A 95, 043615 (2017) 11 pages.

Lee et al., "Defect-free atomic array formation using the Hungarian matching algorithm," Physical Review A 95, 053424 (2017), 6 pages.

Non-Final Office Action received for U.S. Appl. No. 15/934,457 dated Apr. 22, 2019, 47 pages.

Zhang et al., "Quantized Majorana Conductance", 2017, pp. 1-26.

Wootton J. R., Braiding Majoranas in a five qubit experiment, Sep. 25, 2016, pp. 1-6.

Final Office Action received for U.S. Appl. No. 15/934,457 dated Sep. 9, 2019, 145 pages.

Non-Final Office Action received for U.S. Appl. No. 16/751,429 dated Jan. 12, 2021, 15 pages.

Chanda et al., "Quantum Topological Error Correction Codes: The Classical-to-Quantum Isomorphism Perspective", IEEE, Jan. 18, 2017.

List of IBM Patents or Applications Treated as Related.

Notice of Acceptance for patent application received for Australian Patent Application Serial No. 2020262057 dated Jul. 11, 2023, 3 pages.

Litinski et al., "Combining Topological Hardware and Topological Software: Color-Code Quantum Computing with Topological Superconductor Networks", Physical Review X, vol. 7, No. 031048, Sep. 15, 2017, 26 pages.

Notice of Reasons for Refusal received for Japanese Patent Application Serial No. 2020-542845 dated Jul. 25, 2023, 6 pages.

First Office Action received for Chinese Patent Application Serial No. 201980016564.5 dated Jan. 26, 2024, 13 pages(Including English Translation).

Decision to Grant a Patent received for Japanese Patent Application Serial No. 2020-542845 dated Jan. 9, 2024, 5 pages(Including English Translation).

Notice for Eligibility of Grant received for Singaporean Patent Application Serial No. 11202109842Y dated Jan. 12, 2024, 4 pages.

REDUCING QUBIT FREQUENCY COLLISIONS THROUGH LATTICE DESIGN

BACKGROUND

The subject disclosure relates generally to quantum computing, and more particularly to a lattice arrangement of qubits for quantum computations.

Quantum information processing (quantum computing) holds the potential for solving certain categories of mathematical problems that are intractable with conventional machine computations. Quantum computing employs quantum physics to encode information; for example, a quantum computer can employ quantum bits (qubits), which are basic units of quantum information, and thus a quantum computer can employ qubits to encode information. Building a highly useful quantum computer will need to have likely on the order of millions of physical qubits.

Many conventional quantum computer architectures are arranged with the physical qubits coupled vertically and horizontally to nearest neighbor qubits, forming a two-dimensional grid. However, the frequencies of qubits are not well controllable in some physical systems implementing qubits, and in practice, qubits have a spread in frequency due to imperfections following fabrication. Some ranges of frequencies are such that a gate comprised of two neighboring qubits does not work well, if at all, which is referred to as a frequency collision, which prohibits logical operations between those qubits. In extreme cases the frequency ranges are sufficiently bad such that a useless qubit results, basically resulting in a hole in the lattice.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a device can comprise qubits arranged in a lattice arrangement, in which the lattice arrangement comprises adjacent structures having vertices connected by edges. The qubits can be positioned on the vertices, and a qubit in the lattice arrangement directly connects to not more than three other qubits, or connects to another qubit via a coupling qubit on an edge between two qubits on a vertex. The device thus reduces the number of connections between qubits, which in turn reduces the chances of frequency collisions.

The adjacent structures can comprise hexagons, dodecagons or octagons. The adjacent structures can comprise hexagons having qubits on the edges between the vertices of the hexagons, dodecagons having qubits on the edges between the vertices of the dodecagons, octagons having qubits on the edges between the vertices of the octagons or rectangles having qubits on the edges between the vertices of the rectangles. The coupling qubit on the edge between the two qubits on the vertices can comprise a control qubit, and the two qubits on the vertices can comprise target qubits. The structures thus reduce the number of connections between qubits, which in turn reduces the chances of frequency collisions.

According to another embodiment, a superconducting qubit lattice is provided. The superconducting qubit lattice can comprise superconducting target qubits and superconducting control qubits, in which the superconducting qubit lattice can comprise adjacent structures having vertices connected by edges. The superconducting target qubits can be positioned on the vertices and the superconducting control qubits can be positioned on the edges. A first superconducting target qubit can connect to a second superconducting target qubit via a superconducting control qubit on an edge between the first superconducting target qubit and the second superconducting target qubit. The adjacent structures can comprise hexagons having superconducting control qubits on the edges between the vertices of the hexagons, dodecagons having superconducting control qubits on the edges between the vertices of the dodecagons, octagons having superconducting control qubits on the edges between the vertices of the octagons, or rectangles having superconducting control qubits on the edges between the vertices of the rectangles. The superconducting qubit lattice and the structures thus reduce the number of connections between qubits, which in turn reduces the chances of frequency collisions.

According to yet another embodiment, a superconducting qubit lattice is provided. The superconducting qubit lattice can comprise superconducting qubits, in which the superconducting qubit lattice comprises adjacent structures having vertices connected by edges. The superconducting qubits can be positioned on the vertices. A superconducting qubit connects to not more than three other superconducting qubits. The adjacent structures can comprise hexagons, dodecagons or octagons. The superconducting qubit can indirectly connect to the not more than three other superconducting qubits via a coupling superconducting qubit. A first superconducting qubit can connect to a second superconducting qubit via a coupling superconducting qubit on an edge between the first superconducting qubit on a first vertex and the second superconducting qubit on a second vertex. The superconducting qubit lattice and the structures thus reduce the number of connections between qubits, which in turn reduces the chances of frequency collisions.

According to yet another embodiment, a superconducting qubit lattice is provided. The superconducting qubit lattice can comprise superconducting target qubits, and superconducting control qubits. The superconducting qubit lattice can comprise adjacent structures having vertices connected by edges. The superconducting target qubits can be positioned on the vertices and the superconducting control qubits can be positioned on the edges. A first superconducting target qubit can connect to a second superconducting target qubit via a superconducting control qubit on an edge between the first superconducting target qubit and the second superconducting target qubit. Logic operations between adjacent superconducting target and control qubits can be implemented by driving the superconducting control qubit at or near the frequency of the superconducting target qubit. The superconducting qubit lattice thus reduces the number of connections between qubits, which in turn reduces the chances of frequency collisions.

The adjacent structures can comprise hexagons. The adjacent structures can comprise dodecagons, or the adjacent structures can comprise octagons. The adjacent structures can comprise hexagons having superconducting control qubits on the edges between the vertices of the hexagons, dodecagons having superconducting control qubits on the edges between the vertices of the dodecagons, octagons having superconducting control qubits on the edges between the vertices of the octagons or rectangles having superconducting control qubits on the edges between the vertices of the rectangles. The structures reduce the number of connections between qubits, which in turn reduces the chances of frequency collisions.

DETAILED DESCRIPTION

Figure 1:
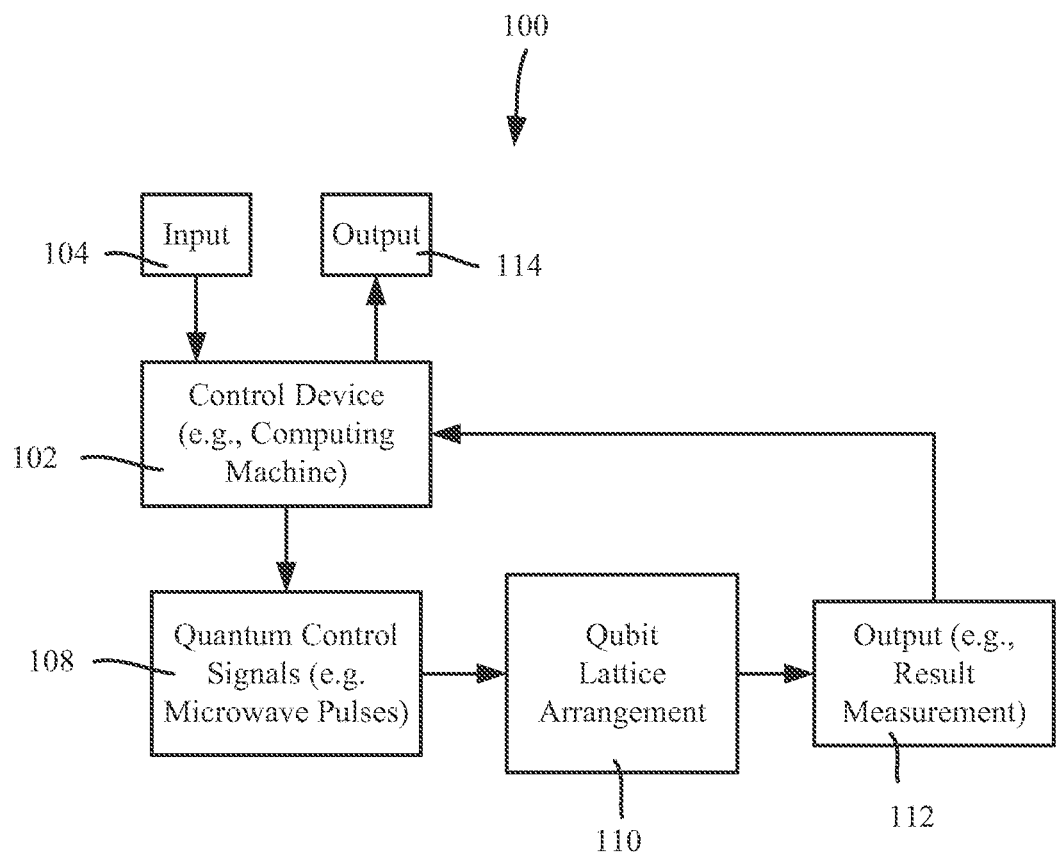
FIG. 1 is an example block diagram in which a qubit lattice arrangement, e.g., described with reference to FIGS. 2-11, can be implemented according to an example embodiment of the present disclosure.

The following detailed description is merely illustrative and is not intended to limit embodiments and/or application or uses of embodiments. Furthermore, there is no intention to be bound by any expressed or implied information presented in the preceding sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Further, it is to be understood that the present disclosure will be described in terms of a given illustrative architecture; however, other architectures, structures and/or operations can be varied within the scope of the present disclosure.

It will also be understood that when an element such as a qubit is referred to as being coupled to or connected to another element, it can be directly coupled to or connected to the other element, or indirectly coupled to or connected to the other element by one or more intervening elements that can be present. In contrast, only if and when an element is referred to as being "directly" coupled to or connected to are there no intervening element(s) present, that is, only if and when an element is referred to as being "directly connected" or "directly coupled" to another element, are there no intervening element(s) present.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

A problem with conventional qubit arrangements is that the two-dimensional horizontal and vertical grid means that any qubit has four potential frequency collisions, given its four directly connected neighbors; (naturally a given qubit on the perimeter of the grid has less neighbors, but these qubits in a large grid structure are relatively small in number compared to non-perimeter qubits, and are not separately described herein). Note that it is also feasible to have horizontal, vertical and diagonal connections, corresponding to eight potential frequency collisions, which is likely even more problematic.

One solution described herein is to reduce the connectivity of an individual qubit to other, neighboring qubits by arranging the qubits with different lattice geometries, therefore lowering the likelihood of a frequency collision between neighboring qubits. Another solution described herein is to reduce the connectivity of an individual qubit to other, neighboring qubits by arranging the qubits with different lattice geometries, and assigning different roles to qubits; for example, one geometry arranges target qubits on vertices of the geometric (polygon) structures that make up the lattice, and control qubits on the edges between the vertices.

Referring now to the drawings in which like numerals represent the same or similar elements, FIG. 1 shows a general system 100 in which the technology described herein can be implemented. In the example of FIG. 1, a control device such as a conventional or dedicated computing machine 102 receives input 104 such as from a program, process, user or other suitable entity. Based on the input 104, the control device 102 generates quantum signals 108 that operate selected ones of the qubits in the qubit lattice arrangement 110. The output from the lattice arrangement 110 can, for example, comprise measurements of the qubit states that are fed back to the control device 102 such as for providing corresponding output 114 representing the experimental results or the like.

Figure 2:
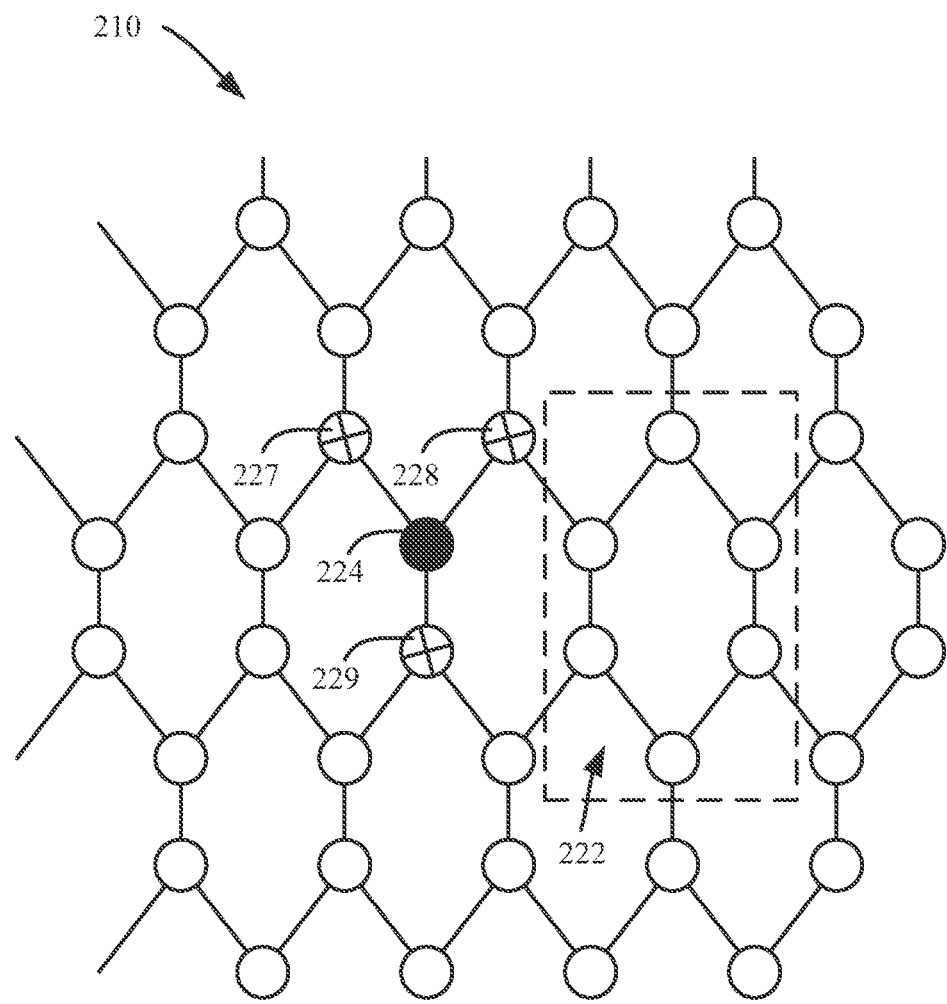
FIG. 2 is a representation of an example qubit lattice arrangement in which hexagonal structures provide reduced qubit connections, according to an example embodiment of the present disclosure.

Turning to example structures that can be used to form a qubit lattice arrangement such as used as the lattice arrangement 110 of FIG. 1, FIG. 2 shows a lattice arrangement 210 comprising qubits (represented as circles in FIG. 2) arranged as hexagon structures, e.g., as represented via the hexagon structure 222 highlighted in the dashed box. As can be seen, the hexagon structures are adjacent one another, and share two vertices and an edge with neighboring hexagon structures. Again, this is a general rule for internal hexagon structures, and does not address hexagon structures on the perimeter of the lattice arrangement 210.

The qubits in FIG. 2 are on the vertices of the hexagon structures, and in general the qubits are generally distributed symmetrically in the lattice arrangement 210. Note that the hexagon structures represented in FIG. 2 are not depicted as regular hexagons, however they can be regular hexagons. In addition to being adjacent other hexagon structures, it is seen that the qubits are generally distributed evenly in the lattice arrangement 210.

Unlike horizontal and vertical grids in which internal qubits have four direct connections, it can be readily appreciated that the qubits in FIG. 2 at most are directly connected to three other qubits. Thus, for example the qubit 224, (highlighted as a black circle in FIG. 2), is directly connected only to qubits to 227-229 (highlighted via crossed circles). Because of the reduced number of connections (relative two horizontal and vertical grids), a qubit in one of the hexagonal structures of FIG. 2 is statistically less likely to have a frequency collision with one of its neighboring qubits.

Figure 3:
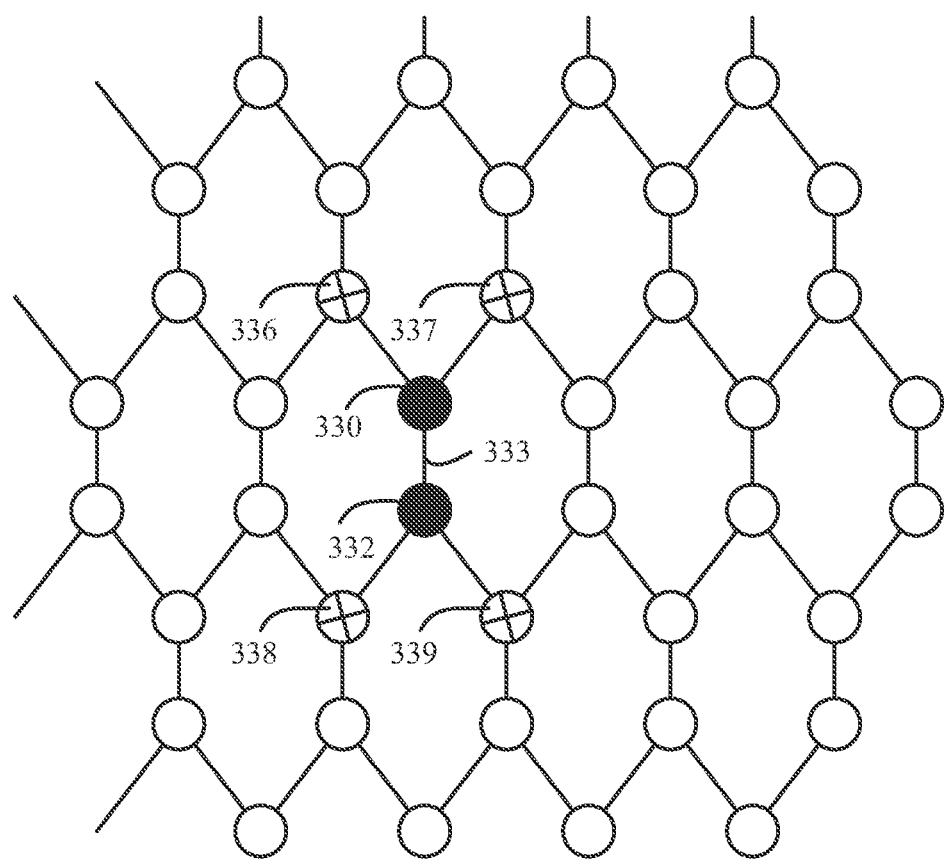
FIG. 3 is a representation of an example qubit lattice arrangement in which hexagonal structures provide reduced qubit connections, including for two qubit gates, according to an example embodiment of the present disclosure.

FIG. 3 illustrates how in the hexagonal lattice arrangement 210 two neighboring qubits 330, 332 connected by a bus 333 (the qubits are represented as black circles, e.g., forming a two-qubit gate) have only four other qubit frequencies that can cause crosstalk with the four qubits 336-339 that neighbor the gate formed by the two-qubits 330, 332. As can be readily appreciated, a similar two-qubit gate in a horizontal and vertical grid arrangement has six neighboring qubits, increasing the likelihood of a frequency collision.

Figure 4:
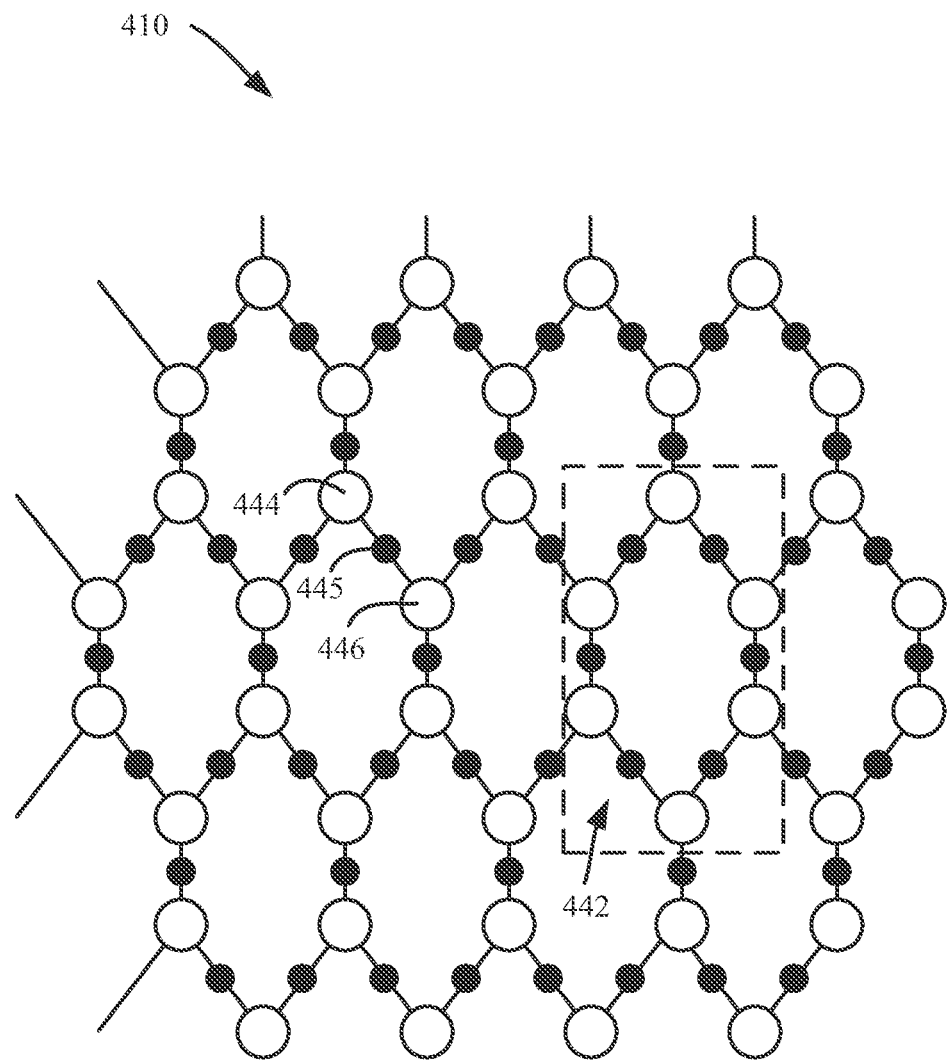
FIG. 4 is a representation of an example qubit lattice arrangement in which hexagonal structures, having qubits on vertices of the hexagonal structures and coupling qubits on edges of the hexagonal structures, provide reduced qubit connections, according to an example embodiment of the present disclosure.

Another embodiment, represented in FIG. 4, is directed towards having assigned roles for qubits, and positioning those qubits on a lattice arrangement to further reduce the likelihood of frequency collisions. In FIG. 4, the small black circles represent coupling qubits, while the larger white circles represent other qubits. In one or more implementations, the coupling qubits are control qubits, while the other qubits are target qubits; (the concept and functionality of control qubits and target qubits are well known in quantum computing, and thus are not described in detail herein). Note that the sizes of the circles are not intended to convey actual relative sizes, but rather to help visually differentiate the two roles of the qubits.

In FIG. 4, the hexagonal structures (e.g., one of which is represented by the dashed box 442) are generally similar to those of FIGS. 2 and 3, in that some qubits are positioned on the vertices of the hexagon structures, the hexagon structures are adjacent one another, the qubits are generally evenly spaced, and so on. However, in contrast to FIGS. 2 and 3, the edges between the vertices have coupling (e.g., control) qubits positioned thereon. As can be seen, qubit 444 (e.g., a target qubit) is connected through coupling qubit 445, and thereby indirectly connected to qubit 446. Thus, there are two qubits per bus, namely an edge-positioned coupling (e.g., control) qubit and a vertex-positioned (e.g., target) qubit.

Figure 5:
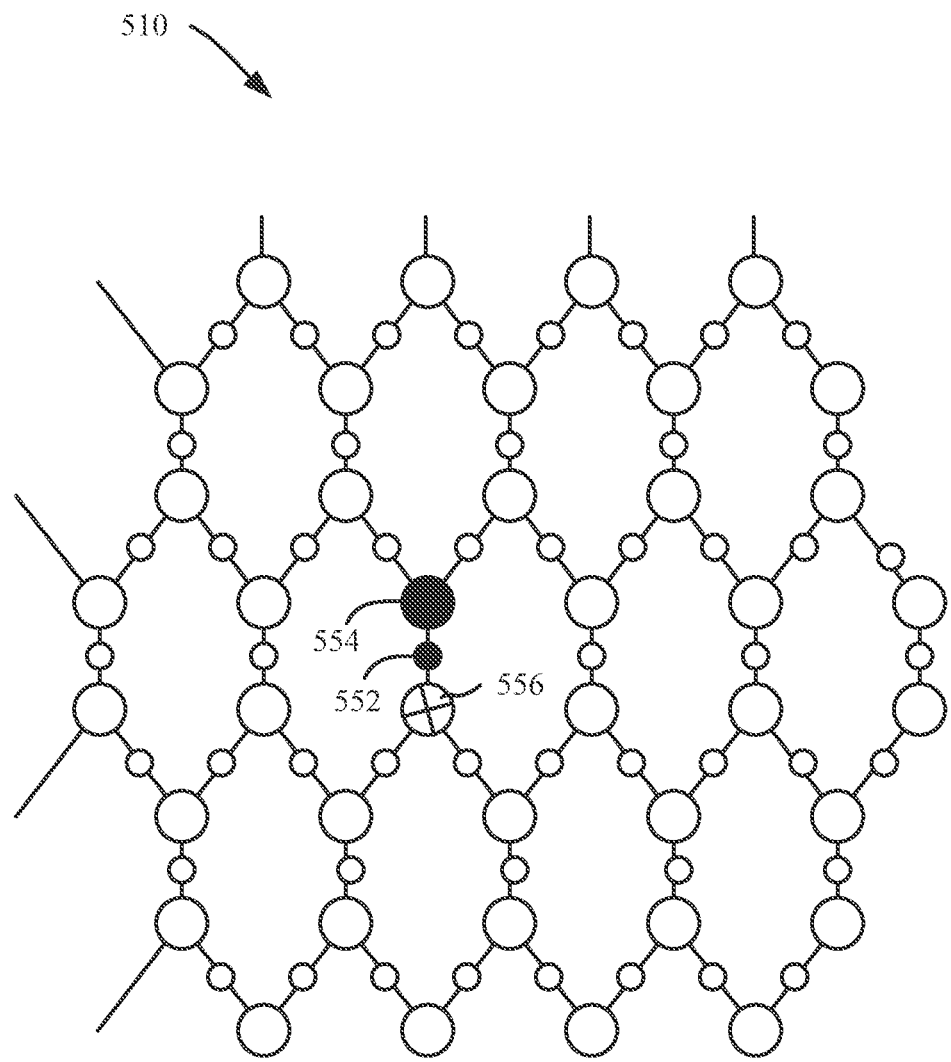
FIG. 5 is a representation of an example qubit lattice arrangement in which hexagonal structures provide reduced qubit connections by having qubits on vertices of the hexagonal structures couple directly only to coupling qubits, according to an example embodiment of the present disclosure.

Accordingly, as represented in FIG. 5, for every two qubit gate (the small and large black circles 552 and 554, respectively), with the control driven at the target, only one other qubit (represented by the "crossed" qubit 556) is directly coupled to the control qubit 552, therefore reducing the number of frequency collisions.

Figure 6:
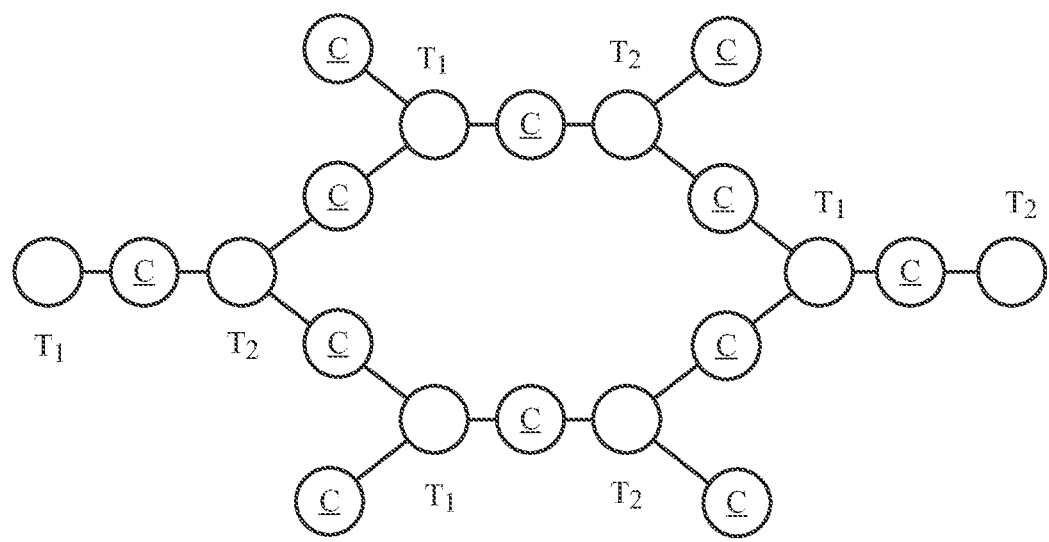
FIG. 6 is a representation of twenty qubits in a generally hexagonal structure of a lattice arrangement, in which control qubits are positioned on edges between target qubits positioned on vertices, according to an example embodiment of the present disclosure.

FIG. 6 shows twenty qubits in a lattice of hexagonal structures; the control qubits (twelve in number, labeled with C's) are only nearest-neighbor coupled to two target qubits (four labeled with $T_1$, four with $T_2$), and only three distinct frequencies are needed. Types of collisions (10 MHz half-width on collision windows), where $\omega$ represents the frequency of the qubit, are type 1: $\omega_{01}^{(j)} \neq \omega_{01}^{(k)}$ and type 2: $\omega_{12}^{(j)} \neq \omega_{01}^{(k)}$ (where j and k are nearest neighbors). Other collisions, where $\Delta$ is the frequency difference between control and target qubits, $\varepsilon$ is the amount that the target frequency is allowed to be above the control frequency, and $\delta$ is the anharmonicity of the qubit, are type 3: $\Delta_{jk} = \omega_{jk} = \omega_j - \omega_k \in (-\varepsilon, -\delta_j)$ and type 4: $\omega_{02}^{(j)}/2 \neq \omega_{01}^{(k)}$, where j represents a control qubit and k represents a target qubit. Still other collisions are type 5: $\omega_{01}^{(k)} \neq \omega_{01}^{(i)}$, type 6: $\omega_{01}^{(k)} \neq \omega_{12}^{(i)}$ and type 7: $\omega_{02}^{(j)} \neq \omega_{01}^{(i)} + \omega_{01}^{(k)}$ (where i represents a spectator qubit, j represents a control qubit and k represents a target qubit).

Figure 7:
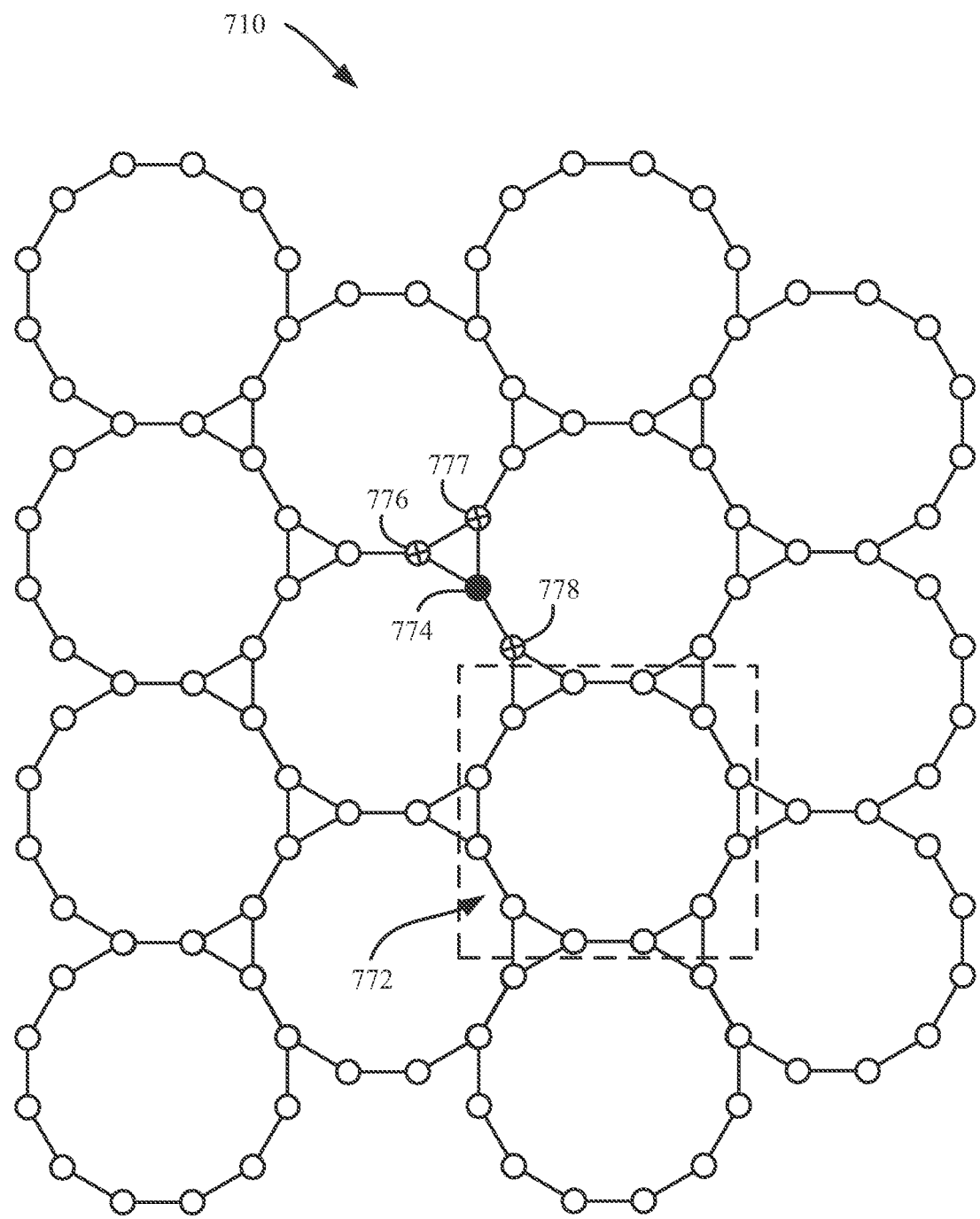
FIG. 7 is a representation of an example qubit lattice arrangement in which dodecagonal structures provide reduced qubit connections, according to an example embodiment of the present disclosure.

FIG. 7 shows another lattice arrangement 710 with two-dimensional structures comprising dodecagons; one such structure is represented in the dashed box 772. As can be seen from FIG. 7, including by the qubit 774 (represented by a black circle) and its neighboring qubits 776-778 (represented by crossed circles), any individual qubit in the lattice arrangement 710 directly connects to a maximum of three other qubits. Although not separately shown, it is understood that any two qubit gate in the lattice arrangement 710 of FIG. 7 directly connects to a maximum of four other qubits.

Figure 8:
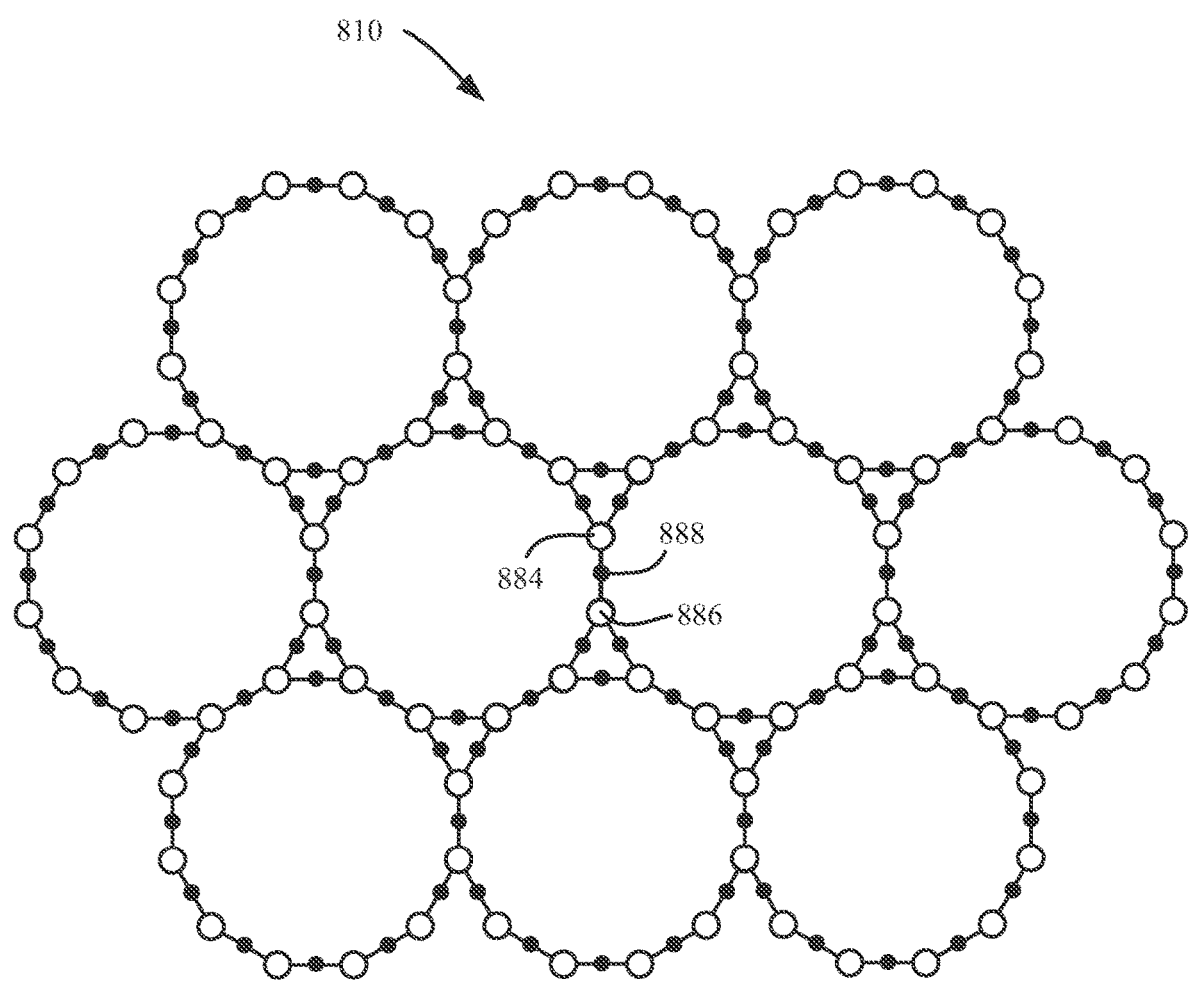
FIG. 8 is a representation of an example qubit lattice arrangement in which dodecagonal structures, having qubits on vertices of the dodecagonal structures and coupling qubits on edges of the dodecagonal structures, provide reduced qubit connections, according to an example embodiment of the present disclosure.

FIG. 8 shows another lattice arrangement 810 with two-dimensional structures comprising dodecagons, in which coupling (e.g., control) qubits are positioned on the edges between the other (e.g., target) qubits positioned on the vertices. As can be seen from FIG. 8, including by the qubits 884 and 886, any individual qubit in the lattice arrangement directly connects only to a coupling qubit, e.g., the coupling qubit 888. Thus, the same reduced frequency collision statistics described above with reference to FIGS. 4 and 5 apply to the lattice arrangement 810 of FIG. 8.

Figure 9:
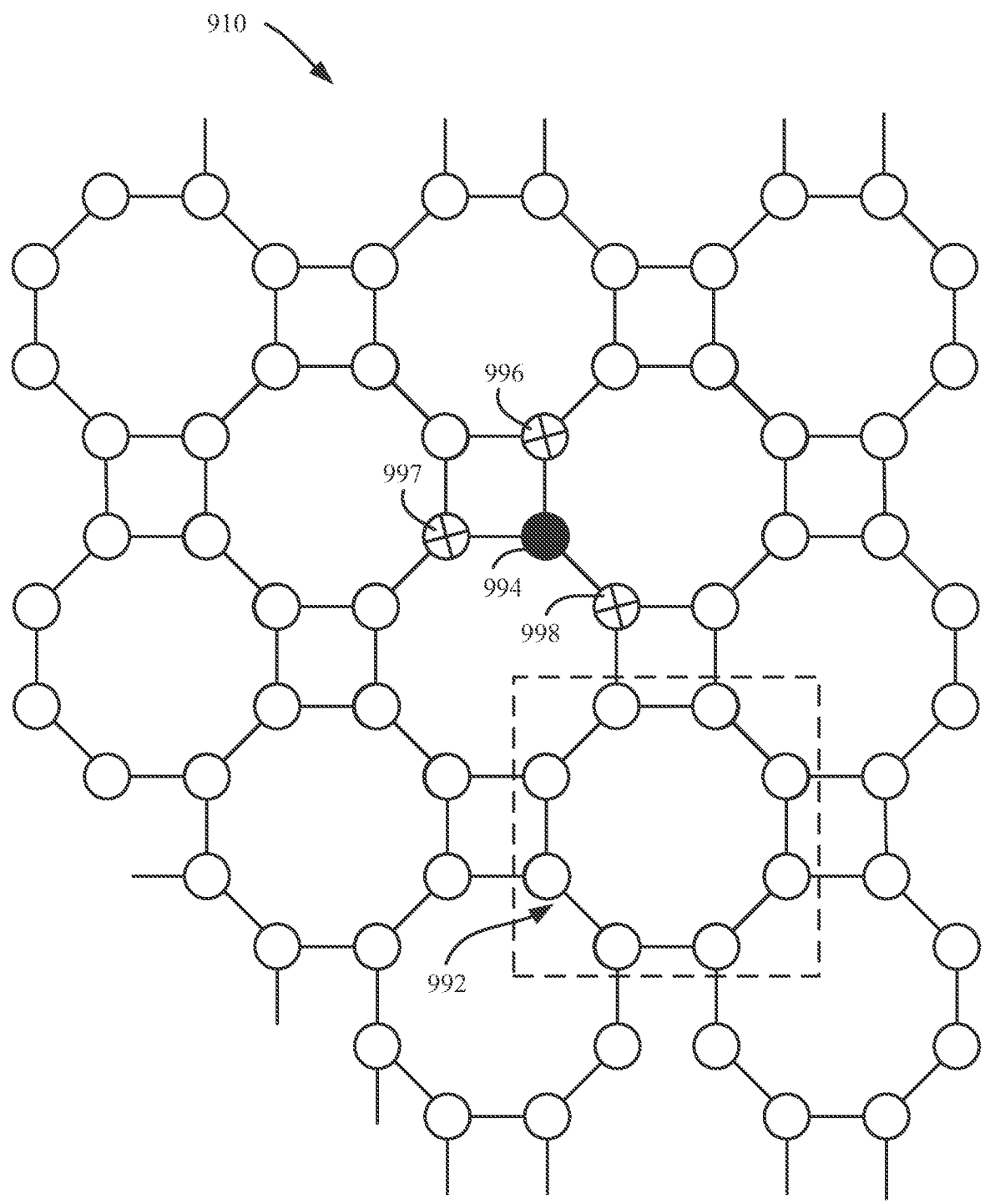
FIG. 9 is a representation of an example qubit lattice arrangement in which octagonal structures provide reduced qubit connections, according to an example embodiment of the present disclosure.

FIG. 9 shows another lattice arrangement 910 with two-dimensional structures comprising octagons; one such structure is represented in the dashed box 992. As can be seen from FIG. 9, including by the qubit 994 (represented by a black circle) and its neighboring qubits 996-998 (represented by crossed circles), any individual qubit in the lattice arrangement 910 directly connects to a maximum of three other qubits. Although not separately shown, it is understood that any two qubit gate in the lattice arrangement 910 of FIG. 9 directly connects to a maximum of four other qubits.

Figure 10:
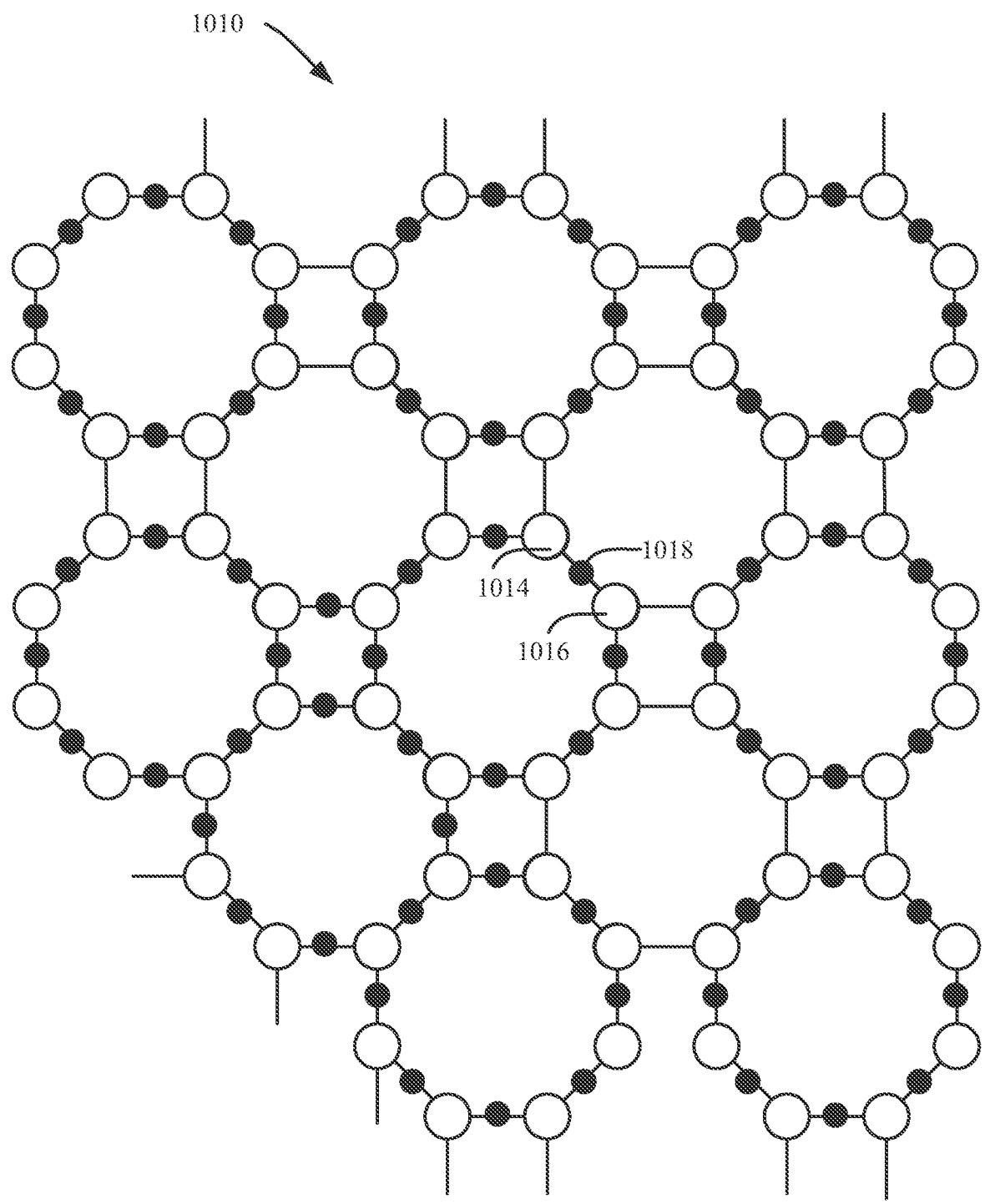
FIG. 10 is a representation of an example qubit lattice arrangement in which octagonal structures, having qubits on vertices of the octagonal structures and coupling qubits on edges of the octagonal structures, provide reduced qubit connections, according to an example embodiment of the present disclosure.

FIG. 10 shows another lattice arrangement 1010 with two-dimensional structures comprising octagons, in which coupling (e.g., control) qubits are positioned on the edges between the other (e.g., target) qubits positioned on the vertices. As can be seen from FIG. 10, including by the qubits 1014 and 1016, any individual qubit in the lattice arrangement directly connects only to a coupling qubit, e.g., the coupling qubit 1018. Thus, the same reduced frequency collision statistics described above with reference to FIGS. 4 and 5 apply to the lattice arrangement 1010 of FIG. 10.

Figure 11:
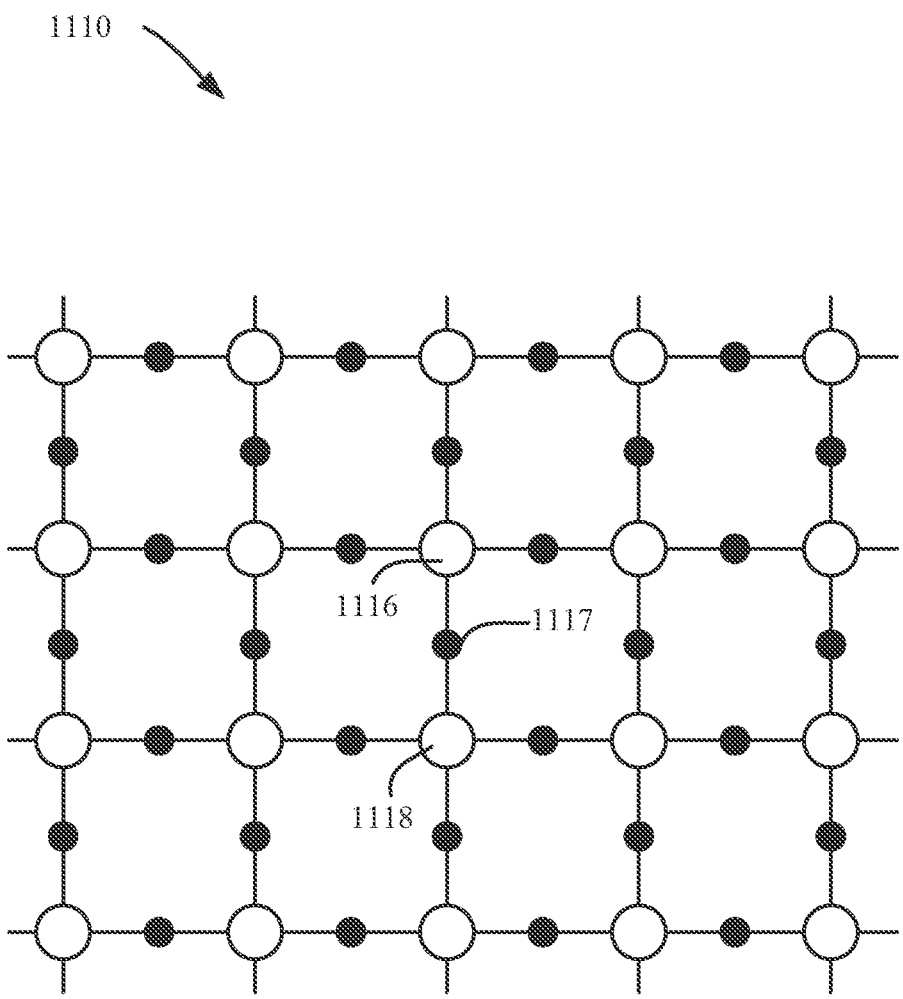
FIG. 11 is a representation of an example qubit lattice arrangement in which rectangular (e.g., square) structures, having qubits on vertices of the rectangular structures and coupling qubits on edges of the rectangular structures, provide reduced qubit connections, according to an example embodiment of the present disclosure.

FIG. 11 shows a grid-like lattice arrangement 1110 with respect to qubits positioned on the vertices of squares (or more generally, rectangles). However, in contrast to other grid-like arrangements, there on coupling qubits on the edges between the other qubits; the qubits on the vertices can be target qubits, and the qubits on the edges can be control qubits. Thus, for example, qubit 1116 directly connects to coupling qubit 1117 (and only to other coupling qubits), and coupling qubit 1117 directly connects to qubit 1118. Thus, the same reduced frequency collision statistics described above with reference to FIGS. 4 and 5 apply to the lattice arrangement 1110 of FIG. 11.

Statistical modeling shows a definite reduction in frequency collisions. Empirical inputs to the model can include definitions of 'collision windows' (known from quantum modeling or from measurement) and measured statistical distribution of qubit frequencies. Design inputs to the statistical model can include number of qubits in the circuit, geometric arrangement of qubits in the circuit, function of the various qubits in the circuit (e.g. their use as "data" or "ancilla" in quantum error correction algorithms), qubit type (e.g. transmon, phase qubit, flux qubit or other type of superconducting qubit), qubit anharmonicity (values in GHz or MHz), number of qubits per bus, intended qubit frequencies (values in GHz) and desired fidelities for cross-resonance (CR) gates.

The following data tables, obtained via Monte Carlo simulations, (in which $\sigma$ represents the standard deviation, $\varepsilon$ represents the amount that the target frequency is allowed to be above the control frequency, $\delta\_C$ represents the anharmonicity of the control qubit and $\delta\_T$ represents anharmonicity of the target qubit) summarize a hexagonal lattice (vertices and edges) with (control qubit frequency) $\omega_c$=5.2 GHz:

| $\sigma$ (MHz) | $\varepsilon$ (MHz) | $\delta\_C$ (MHz) | $\delta\_T$ (MHz) | # samples | Minimum Probability (collision) |
|---|---|---|---|---|---|
| 0 | 0 | −340 | −340 | 100 | 0 |
| 40 | 0 | −340 | −340 | 100 | ~0.90-0.91 |
| 100 | 0 | −340 | −340 | 100 | ~0.99-1.0 |
| 40 | 50 | −340 | −340 | 100 | ~0.88-0.89 |
| 40 | 50 | −390 | −340 | 100 | ~0.87-0.88 |
| 20 | 50 | −340 | −340 | 100 | ~0.65 |
| 20 | 50 | −390 | −340 | 100 | ~0.5 |
| 20 | 50 | −390 | −390 | 100 | ~0.46 |

The following table summarizes the comparing of hexagonal and square lattices (vertices and edges) with $\omega_c$=5.2 GHz:

| Lattice type | $\sigma$ (MHz) | $\varepsilon$ (MHz) | $\delta\_C$ (MHz) | $\delta\_T$ (MHz) | # samples | Minimum Probability (collision) |
|---|---|---|---|---|---|---|
| Hex (V&E) | 40 | 50 | −340 | −340 | 100 | ~0.88-0.89 |
| Square (V&E) | 40 | 50 | −340 | −340 | 100 | ~0.91-0.92 |

As can be seen, there is described a technology that reduces connectivity between an individual qubit and other qubits by geometries in lattice designs and thereby lower the likelihood of frequency collisions. The lattice designs comprise structures that provide for an individual qubit to have a maximum of three directly connected other qubits, or to have qubits connected by coupling qubits.

One or more aspects are directed towards a device, comprising qubits arranged in a lattice arrangement, in which the lattice arrangement comprises adjacent structures having vertices connected by edges. The qubits can be positioned on the vertices, and a qubit in the lattice arrangement directly connects to not more than three other qubits, or connects to another qubit via a coupling qubit on an edge between two qubits on a vertex.

The adjacent structures can comprise hexagons. The adjacent structures can comprise hexagons having qubits on the edges between the vertices of the hexagons.

The adjacent structures can comprise dodecagons. The adjacent structures can comprise dodecagons having qubits on the edges between the vertices of the dodecagons.

The adjacent structures can comprise octagons. The adjacent structures can comprise octagons having qubits on the edges between the vertices of the octagons.

The adjacent structures can comprise rectangles having qubits on the edges between the vertices of the rectangles.

The coupling qubit on the edge between the two qubits on the vertices can comprise a control qubit, and the two qubits on the vertices can comprise target qubits.

One or more aspects are directed towards a superconducting qubit lattice. The superconducting qubit lattice can comprise superconducting target qubits and superconducting control qubits, in which the superconducting qubit lattice can comprise adjacent structures having vertices connected by edges. The superconducting target qubits can be positioned on the vertices and the superconducting control qubits can be positioned on the edges. A first superconducting target qubit can connect to a second superconducting target qubit via a superconducting control qubit on an edge between the first superconducting target qubit and the second superconducting target qubit.

The adjacent structures can comprise hexagons having superconducting control qubits on the edges between the vertices of the hexagons. The adjacent structures can comprise dodecagons having superconducting control qubits on the edges between the vertices of the dodecagons. The adjacent structures can comprise octagons having superconducting control qubits on the edges between the vertices of the octagons. The adjacent structures can comprise rectangles having superconducting control qubits on the edges between the vertices of the rectangles.

One or more aspects are directed towards a superconducting qubit lattice. The superconducting qubit lattice can comprise superconducting qubits, in which the superconducting qubit lattice comprises adjacent structures having vertices connected by edges. The superconducting qubits can be positioned on the vertices. A superconducting qubit connects to not more than three other superconducting qubits.

The adjacent structures can comprise hexagons, dodecagons or octagons. The superconducting qubit can indirectly connect to the not more than three other superconducting qubits via a coupling superconducting qubit. A first superconducting qubit can connect to a second superconducting qubit via a coupling superconducting qubit on an edge between the first superconducting qubit on a first vertex and the second superconducting qubit on a second vertex.

One or more aspects are directed towards a superconducting qubit lattice. The superconducting qubit lattice can comprise superconducting target qubits, and superconducting control qubits. The superconducting qubit lattice can comprise adjacent structures having vertices connected by edges. The superconducting target qubits can be positioned on the vertices and the superconducting control qubits can be positioned on the edges. A first superconducting target qubit can connect to a second superconducting target qubit via a superconducting control qubit on an edge between the first superconducting target qubit and the second superconducting target qubit. Logic operations between adjacent superconducting target and control qubits can be implemented by driving the superconducting control qubit at or near the frequency of the superconducting target qubit.

The adjacent structures can comprise hexagons. The adjacent structures can comprise dodecagons, or the adjacent structures can comprise octagons.

The adjacent structures can comprise hexagons having superconducting control qubits on the edges between the vertices of the hexagons. The adjacent structures can comprise dodecagons having superconducting control qubits on the edges between the vertices of the dodecagons. The adjacent structures can comprise octagons having superconducting control qubits on the edges between the vertices of the octagons. The adjacent structures can comprise rectangles having superconducting control qubits on the edges between the vertices of the rectangles.

What has been described above include mere examples. It is, of course, not possible to describe every conceivable combination of lattice arrangements, components, materials or the like for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A quantum processing device comprising:
   qubits arranged in a lattice arrangement, in which the lattice arrangement comprises:
   adjacent structures having vertices connected by edges, wherein the qubits are positioned on the vertices, and wherein each of the qubits in the lattice arrangement connects to, thereby being directly adjacent to, with no intervening elements, not more than three other qubits such that a connectivity of each of the qubits to other ones of neighboring qubits, by arranging the qubits with the lattice arrangement, lowers a likelihood of a frequency collision between neighboring ones of the qubits.

2. The quantum processing device of claim 1, wherein the adjacent structures comprise hexagons.

3. The quantum processing device of claim 1, wherein the adjacent structures comprise hexagons having qubits on the edges between the vertices of the hexagons.

4. The quantum processing device of claim 1, wherein the adjacent structures comprise dodecagons.

5. The quantum processing device of claim 1, wherein the adjacent structures comprise dodecagons having qubits on the edges between the vertices of the dodecagons.

6. The quantum processing device of claim 1, wherein the adjacent structures comprise octagons.

7. The quantum processing device of claim 1, wherein the adjacent structures comprise octagons having qubits on the edges between the vertices of the octagons.

8. The quantum processing device of claim 1, wherein the adjacent structures comprise rectangles having qubits on the edges between the vertices of the rectangles.

9. A superconducting qubit lattice of a quantum processing device, comprising:
   superconducting target qubits, and superconducting control qubits, in which the superconducting qubit lattice comprises adjacent structures having vertices connected by edges, wherein the superconducting target qubits are positioned on the vertices and the superconducting control qubits are positioned on the edges, and wherein a first superconducting target qubit connects to a second superconducting target qubit via a superconducting control qubit on an edge between the first superconducting target qubit and the second superconducting target qubit, wherein the superconducting control qubits are distinct from the first superconducting target qubit and from the second superconducting target qubit, and wherein the superconducting qubit lattice outputs one or more measurements of the states of the superconducting qubits for feedback to a control device.

10. The superconducting qubit lattice of the quantum processing device of claim 9, wherein the adjacent structures comprise hexagons having superconducting control qubits on the edges between the vertices of the hexagons.

11. The superconducting qubit lattice of the quantum processing device of claim 9, wherein the adjacent structures comprise dodecagons having superconducting control qubits on the edges between the vertices of the dodecagons.

12. The superconducting qubit lattice of the quantum processing device of claim 9, wherein the adjacent structures comprise octagons having superconducting control qubits on the edges between the vertices of the octagons.

13. The superconducting qubit lattice of the quantum processing device of claim 9, wherein the adjacent structures comprise rectangles having superconducting control qubits on the edges between the vertices of the rectangles.

14. A superconducting qubit lattice of a quantum processing device, comprising: superconducting qubits, in which a lattice arrangement of the superconducting qubit lattice comprises adjacent structures having vertices connected by edges, wherein the superconducting qubits are positioned on the vertices, and in which each of the superconducting qubits connects, and thereby is adjacent to, not more than three other superconducting qubits such that a connectivity of each of the superconducting qubits to other ones of neighboring superconducting qubits, by arranging the superconducting qubits with the lattice arrangement, lowers a likelihood of a frequency collision between neighboring ones of the superconducting qubits, and wherein a first superconducting qubit connects to a second superconducting qubit only via a coupling superconducting qubit on an edge between the first superconducting qubit on a first vertex and the second superconducting qubit on a second vertex.

15. The superconducting qubit lattice of the quantum processing device of claim 14, wherein the adjacent structures comprise hexagons.

16. The superconducting qubit lattice of the quantum processing device of claim 14, wherein the adjacent structures comprise dodecagons or octagons.

17. A superconducting qubit lattice, comprising:
a group of qubits comprising superconducting target qubits, and superconducting control qubits, in which a lattice arrangement of the superconducting qubit lattice comprises adjacent structures having vertices connected by edges, wherein the superconducting target qubits are positioned on the vertices and the superconducting control qubits are positioned on the edges, wherein a first superconducting target qubit connects to a second superconducting target qubit via a superconducting control qubit on an edge between the first superconducting target qubit and the second superconducting target qubit, wherein the superconducting qubit lattice is adapted to drive the superconducting control qubit at or near the frequency of at least one of the first superconducting target qubit and the second superconducting target qubit, thereby implement a logic operation between the first superconducting target qubit and the second superconducting target qubit, and wherein each of the qubits in the lattice arrangement connects to, thereby being directly adjacent to, with no intervening elements, not more than three other qubits such that a connectivity of each of the qubits to other ones of neighboring qubits, by arranging the qubits with the lattice arrangement, lowers a likelihood of a frequency collision between neighboring ones of the qubits.

18. The superconducting qubit lattice of claim 17, wherein the adjacent structures comprise hexagons.

19. The superconducting qubit lattice of claim 17, wherein the adjacent structures comprise dodecagons, or wherein the adjacent structures comprise octagons.

20. The superconducting qubit lattice of claim 17, wherein the adjacent structures comprise hexagons having superconducting control qubits on the edges between the vertices of the hexagons.

21. The superconducting qubit lattice of claim 17, wherein the adjacent structures comprise dodecagons having superconducting control qubits on the edges between the vertices of the dodecagons.

22. The superconducting qubit lattice of claim 17, wherein the adjacent structures comprise octagons having superconducting control qubits on the edges between the vertices of the octagons.

23. The superconducting qubit lattice of claim 17, wherein the adjacent structures comprise rectangles having superconducting control qubits on the edges between the vertices of the rectangles.

* * * * *